United States Patent
Liu

(10) Patent No.: US 7,443,211 B2
(45) Date of Patent: Oct. 28, 2008

(54) TRANSMITTER AND TRANSMISSION CIRCUIT

(75) Inventor: Chih-Min Liu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 17 days.

(21) Appl. No.: 11/562,426

(22) Filed: Nov. 22, 2006

(65) Prior Publication Data

US 2007/0139086 A1   Jun. 21, 2007

(30) Foreign Application Priority Data

Dec. 16, 2005   (TW) .............................. 94144874 A

(51) Int. Cl.
*H03B 1/00* (2006.01)
(52) U.S. Cl. ..................... 327/108; 327/110; 327/113; 326/30; 326/82
(58) Field of Classification Search ................. None
See application file for complete search history.

(56) References Cited

U.S. PATENT DOCUMENTS

| | | | |
|---|---|---|---|
| 5,939,904 A * | 8/1999 | Fetterman et al. ............. 327/67 |
| 6,169,676 B1 * | 1/2001 | Dahler et al. ................. 363/71 |
| 6,262,606 B1 * | 7/2001 | Tamjidi ...................... 327/108 |
| 6,393,062 B1 | 5/2002 | Furman | |
| 7,030,663 B2 * | 4/2006 | McCorkle et al. ........... 327/108 |
| 7,068,077 B1 * | 6/2006 | Reinschmidt ................ 326/83 |
| 7,236,018 B1 * | 6/2007 | Wang et al. ................. 327/108 |
| 2003/0076136 A1 | 4/2003 | McCorkle | |

* cited by examiner

*Primary Examiner*—An T. Luu
(74) *Attorney, Agent, or Firm*—Winston Hsu

(57) ABSTRACT

Transmitter and transmission circuit. For realizing a differential transmitter, a switch circuit is connected between two load transistors of two complementary MOS pairs. The switch circuit can have two inductors. When the two complementary MOS pairs are conducting current to drive signal transition at output nodes, the inductors open to make the load transistors stop draining current. Also, the switch circuit can have switch transistor controlled by an edge detector for detecting raising and falling edges of the input signals, such that the switch circuit can make the load transistors stop draining current accordingly. In this way, raising and falling edges of the output signals are emphasized to improve signal propagation.

13 Claims, 12 Drawing Sheets

TRANSMITTER AND TRANSMISSION CIRCUIT

BACKGROUND OF THE INVENTION

1. Field of the Invention

The present invention provides a transmitter and a transmission circuit, and more particularly, a transmitter and a transmission circuit with the compensation of the equivalent inductance effect for improving the quality of the transmission signals.

2. Description of the Prior Art

In modern society, every kind of information, data, document, video file has been transformed into electrical signals. How to transmit electrical signals for information circulation more effectively has also become the target of the modern information industries. For instance, in the electronic system or network system, data exchange between different circuits, devices, and terminals are accomplished by buses or network transmission lines. Therefore, raising the efficiency of the signal transmission between circuits, maintaining the quality of the signal transmission, and lowering the power dissipation of the signal transmission contribute to the rises of the entire efficiency and the performance of the system.

Generally, when a transmission circuit transmits signals to a receiving circuit through connections (i.e. buses or network cables), the transmission circuit inputs the signals to the transmitter which transforms the input signals into output signals and then transmits them to the receiving circuit. However, as known by those skilled in the art, the quality of the signal transmission are affected by the natural characteristics of the connection (i.e. the connection length, the equivalent output impendence, and load of the connection) and the signal itself (i.e. the frequency, and the clock). For instance, the transmission circuit transmits a signal of the square waveform to the receiving circuit, but in fact, the waveform of the signal at the receiving circuit is changed from square into saw-tooth since the signal is weakened during the transmission process. Thus, the receiving circuit receives the signal different from the original one, causing the receiving circuit to misread the original signal.

In the prior art, to improve such bad transmission characteristics, two transmitters and a clock delay circuit are used in the transmission circuit. The waveform of the output signal is pre-emphasized so that the amplitudes at the rising edges and the falling edges of the waveform are strengthened and the distortion is reduced. However, there are disadvantages of the prior art. First, the prior art uses two transmitters to synthesize one emphasized output signal, which increases the power dissipation and the layout area. Second, the prior art also needs a clock delay circuit to properly synthesize the emphasized signal, and the clock delay circuit needs an external clock.

Additionally, the prior art also uses the current-mode logic (CML) transmitter. The kind of the transmitter adopts n-type MOS transistors, resistors, and inductors coupled to the resistors in series for emphasizing the waveform of the output signal. However, for realizing such transmitter, the coil structure of the inductor needs a great deal of layout area and the selection of the inductor is not so flexible, which is not convenient.

SUMMARY OF THE INVENTION

A transmission circuit is disclosed that receives at least an input signal and provides an output signal corresponding to each input signal. The circuit comprises a transmitter. The transmitter comprises at least a drive circuit, a load unit, and a switch circuit. Each drive circuit corresponds to an input signal and an output node individually providing currents of different directions according to the voltage of the corresponding input signal. Each load unit corresponds to one of the output nodes and matches the output impedance of the output nodes. The switch circuit couples in series to each load unit at each output node, receives the detection signal, controls each load unit, and sinks current of each output node in response to the detection signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
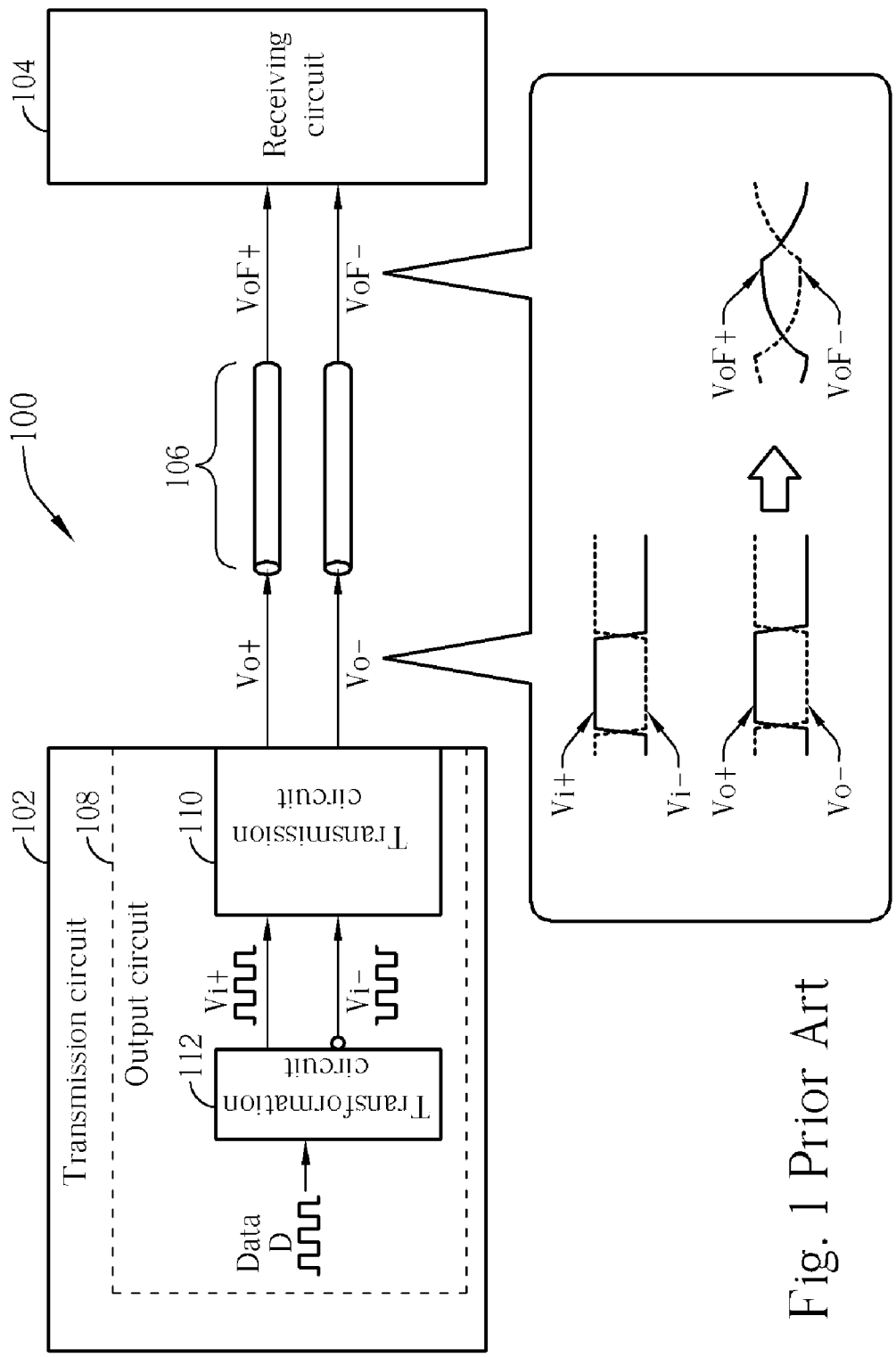
FIG. 1 is a diagram illustrating a transmission circuitry transmitting data to a receiving circuit in an electronic system.

Please refer to FIG. 1, which is a diagram illustrating a transmission circuitry 102 transmitting data to a receiving circuit 104 in an electronic system 100. As known to those skilled in the art, during a transmission process, differential signals have better resistivity to noise, and less effect on peripheral circuits. Thus, in FIG. 1 and the following content, the related techniques of the present invention are based on differential signal transmission. In the electronic system 100, in order to transmit data in the form of differential signals to the receiving circuit 104, the transmission circuitry 102 comprises an output circuit 108. The output circuit 108 comprises a transformation circuit 112 and a transmission circuit 110. The transmission data serves as an input signal D. The input signal D is then transformed into two differential signals Vi+ and Vi− by the transformation circuit 112, and the transmission circuit 110 outputs the differential signals Vo+ and Vo− according to Vi+ and Vi−. The differential output signals Vo+ and Vo− are transmitted through the bus 106, and respectively become remote signals VoF+ and VoF− at receiving circuit 104.

Ideally, the transmission circuit 110 outputs the signals Vo+ and Vo− having the same waveform as those of the signals Vi+ and Vi−. The signals Vo+ and Vo− are transmitted through the bus 106 and become the signals VoF+ and VoF− having the same waveform as those of the signals Vo+ and Vo−. However, as shown in FIG. 1, when the signal Vo+ and the signal Vo− are transmitted through the bus 106, because of the transmission line effect of the bus 106 (i.e. the length of the bus or the equivalent impendence of the bus), the quality of the signal transmission is deteriorated and the remote signals VoF+ and VoF− are distorted. Therefore, it is hard for the receiving circuit 104 to correctly read the information from the signals VoF+ and VoF−.

Figure 2:
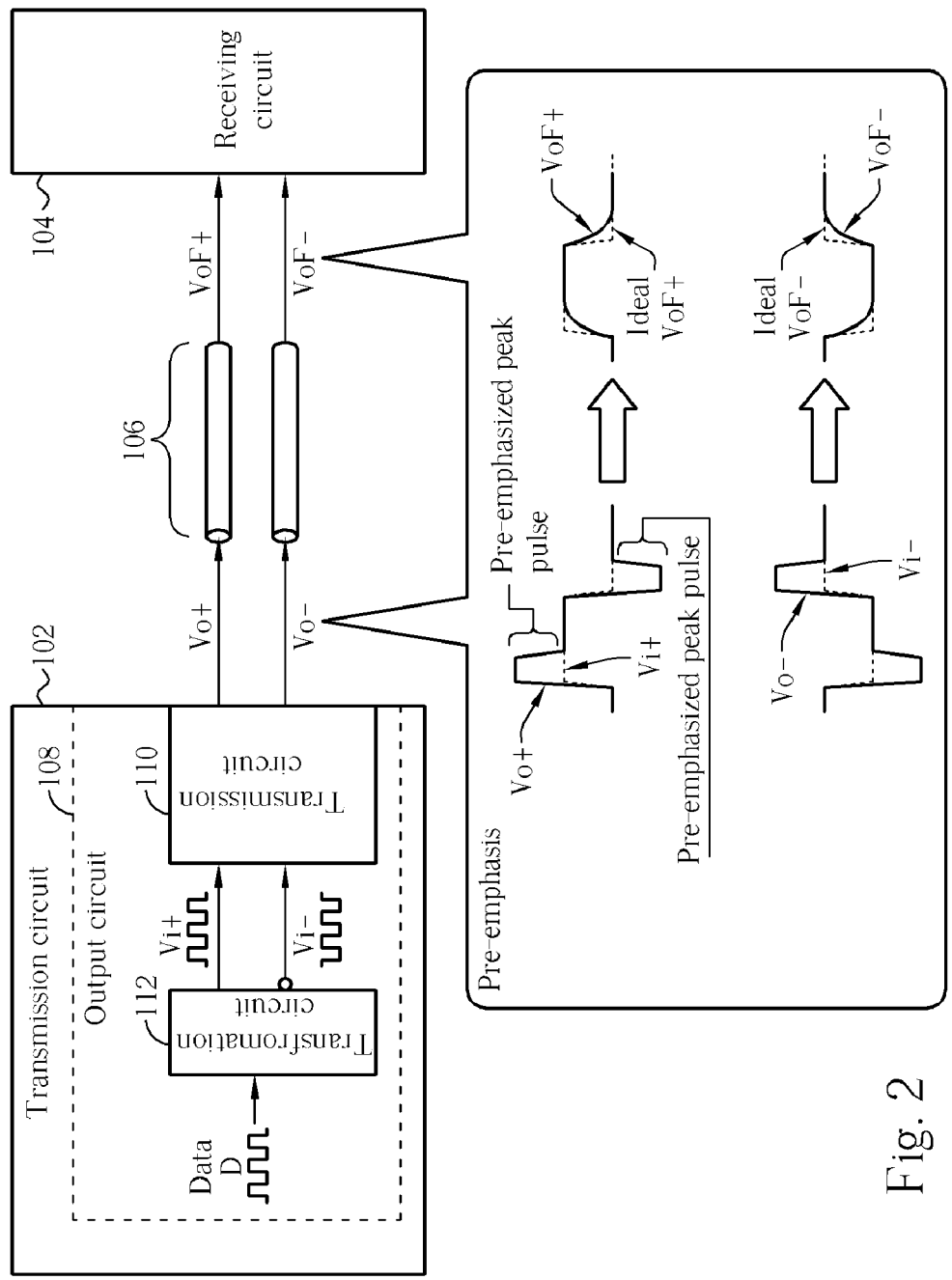
FIG. 2 is a diagram illustrating the electronic system shown in FIG. 1 transmitting signals by using the pre-emphasis.

To overcome the waveform distortion in FIG. 1, a technique "pre-emphasis" is adopted. Please refer to FIG. 2, which is a diagram illustrating the electronic system 100 transmitting signals by using the pre-emphasis. The transmission circuit 110 emphasizes the rising and falling edges of the signals Vo+ and Vo− with the additional peak pulses to resist the transmission line effect of the bus 106. As shown in FIG. 2, the transmission circuit 110 adds an additional emphasized peak pulse respectively at the rising edges of the signals Vo+ and Vo−. Hence, the rising edges of the signals Vo+ and Vo− are diverged and drive the remote signals VoF+ and VoF− more towards the ideal waveforms. Similarly, transmission circuit 110 adds an additional emphasized peak pulse respectively at the falling edges of the signals Vo+ and Vo−. Hence, the falling edges of the signals Vo+ and Vo− are diverged and drive the remote signals VoF+ and VoF− more towards the ideal waveforms.

Figure 3:
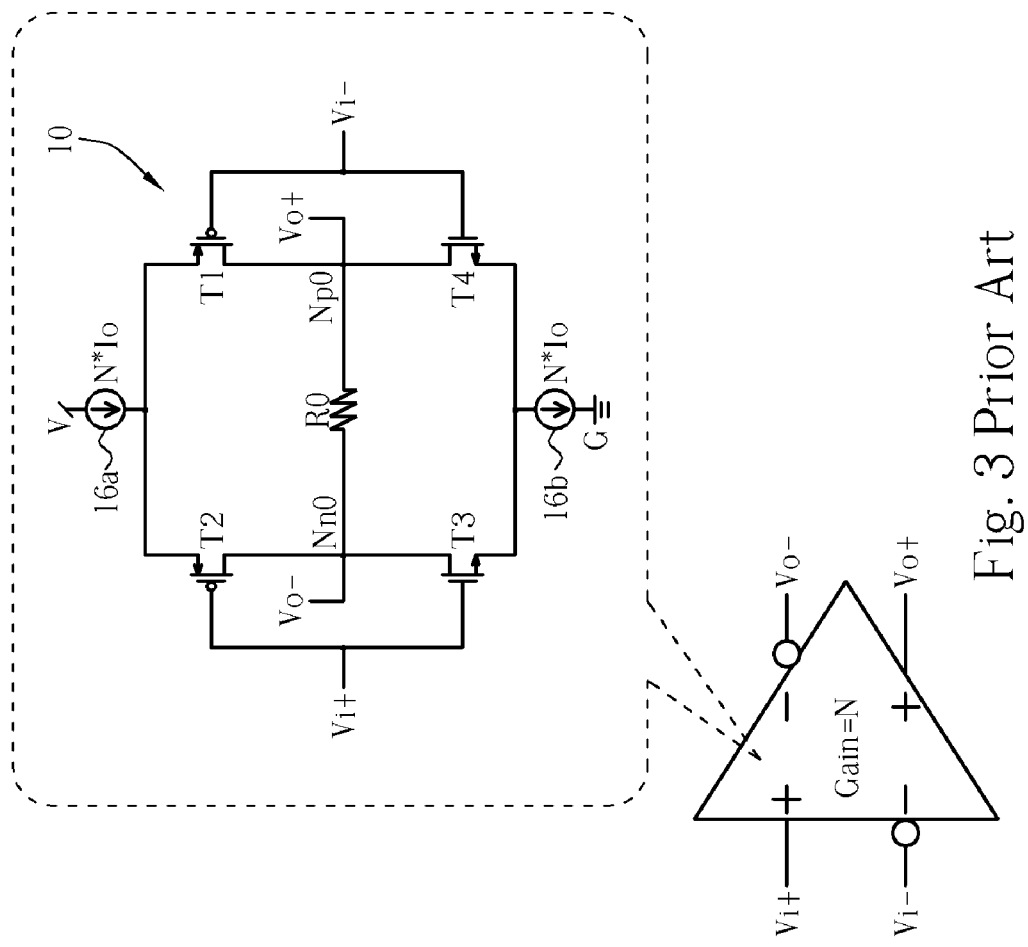
FIG. 3 is a diagram illustrating a circuit structure of a conventional differential transmitter.
Figure 4:
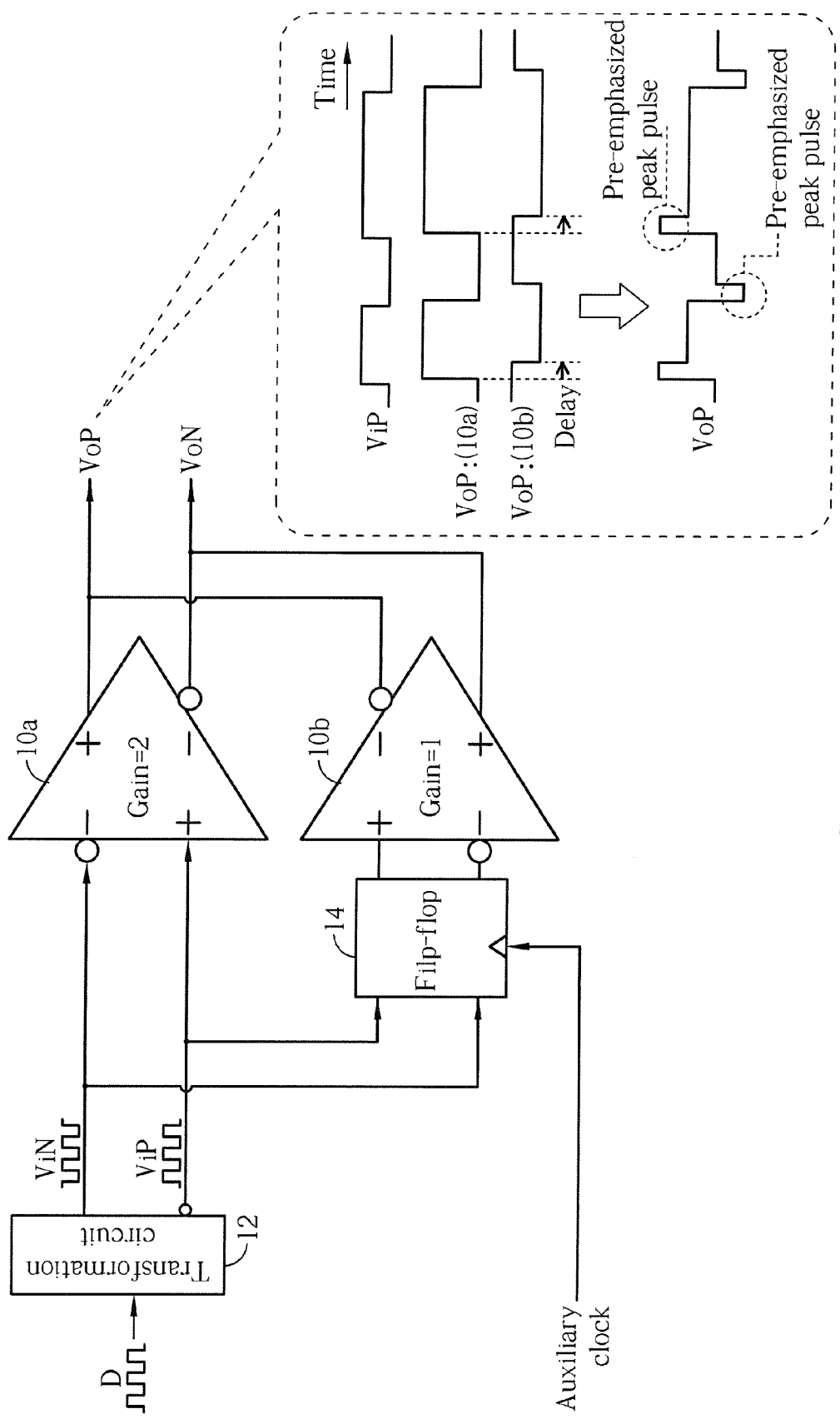
FIG. 4 is a diagram illustrating the circuit structure of two transmitters realizing the pre-emphasis.

Please refer to FIG. 3 and FIG. 4. FIG. 3 is a diagram illustrating a circuit structure of a conventional differential transmitter 10. FIG. 4 is a diagram illustrating the circuit structure of two transmitters realizing the pre-emphasis. As shown in FIG. 3, the conventional differential transmitter 10 (in short as transmitter 10) realizes the transmission circuit 110 in FIG. 1. The transmitter 10 receives two differential input signals Vi+ and Vi− and accordingly outputs two differential output signals Vo+ and Vo−. The transmitter 10 is biased between dc voltage V and G (such as a positive voltage and a grounding voltage). The transmitter 10 comprises two matching p-type MOS transistors T1 and T2, and two matching n-type MOS transistors T3 and T4. A complementary MOS pair is composed of the transistors T1 and T4, whose gate receives the signal Vi− and the drain at the node Np0 transmits the signal Vo+. Another complementary MOS pair is composed of the transistors T2 and T3, whose gate receives the signal Vi+ and the drain at the node Nn0 transmits the signal Vo−. Because the nodes Np0 and Nn0 respectively serve as the output nodes of the transmitter 10 and couple to the bus (not shown in the FIG. 3), the resistor R0 coupled between the nodes Np0 and Nn0 matches the equivalent external output impedance caused by the transmission line affects of the bus. Additionally, the two matching dc current sources 16a and 16b provide currents to the resistor R0.

The operation of the transmitter 10 is described as follows. When the input signal Vi+ is a high-leveled voltage and the input signal Vi− is a low-leveled voltage, the transistors T1 and T3 are turned on while the transistors T2 and T4 are turned off. Thus the currents provided by the current source 16a flow from the node Np0 to the node Nn0 so that the voltage of the node Np0 is higher than that of the node Nn0. It is equivalent that a high-leveled voltage output signal Vo+ and a low-leveled voltage output signal Vo− are established.

On the other hand, if the input signal Vi+ is low-leveled voltage and the input signal Vi− is high-leveled voltage, the transistors T2 and T4 are turned on while the transistors T1 and T3 are turned off. Then the currents provided by the current supply 16a flow from the node Nn0 to the node Np0. Thus the voltage of the node Nn0 is higher than the voltage of the node Np0 and an output signal Vo+ of low-leveled voltage and an output signal Vo− of high-leveled voltage are established. As known from the description above, the voltage difference between the differential output signals Vo+ and Vo− depends on the resistance of the resistor R0 and the size of the current provided by the current sources 16a and 16b. The gain of the transmitter 10 can be changed by changing the size of the current of the current sources 16a and 16b when the resistance of the resistor R0 remains constant. For example, it is assumed that the size of the current provided by the current sources 16a and 16b is Io and the gain of the transmitter 10 is 1. If the size of the current provided by the current sources 16a and 16b is N×Io, then the gain of the transmitter 10 is N.

The transmitter 10 of FIG. 3 directly realizes the transmission circuit 110 of FIG. 1. However, the pre-emphasis of FIG. 2 cannot be realized with only one single conventional differential transmitter 10. As shown in FIG. 4, to realize the pre-emphasis, it is conventionally utilized with two transmitters of different gains and a flip-flop. The output circuit 108 comprises a transformation circuit 12, a flip-flop 14, and two transmitters 10a and 10b. The function of the transformation circuit 12 is as the same as that of the transformation circuit 112. The flip-flop 14 serves as a clock delay circuit for receiving the trigger of an auxiliary clock to delay its output signals than its input signals. To realize the pre-emphasized pulses, the gain of the transmitter 10a is twice as that of the transmitter 10b, and the output nodes of the transmitters 10a and 10b are inversely coupled to each other. In other words, the positive output node of the transmitter 10a is coupled to the negative output node of the transmitter 10b for outputting the signal VoP, and the negative output node of the transmitter 10a is coupled to the positive output node of the transmitter 10b for outputting the signal VoN.

In the conventional technique of FIG. 4, the transmission data (the input signal D) are transformed into two differential signals ViN and ViP by the transformation circuit 12. The two differential signals input into the transmitter 10a and also input through the flip-flop 14 into another transmitter 10b. For example, the transmitter 10a provides signals with the gain of positive 2 and the transmitter 10b, because of the delay generated by the flip-flop 14, provides delayed signals with the gain of negative 1. Thus, the pre-emphasized pulses are synthesized by combining the signals of the transmitters 10a and 10b.

However, there are still disadvantages of the conventional technique in FIG. 4. First, the conventional technique utilizes two transmitters 10a and 10b of different gains to synthesize the emphasized signals, causing more power dissipation and layout area. Second, the conventional technique synthesizes the emphasized signals with a flip-flop serving as a clock delay circuit, causing the need of an auxiliary clock.

Additionally, in the conventional technique of FIG. 4, the transmitter is interfered with by some actual factors, e.g. charge injection and clock feed-through. During the synthesizing process, the actual factors of the transmitter affect the ideality of the emphasized signals. The charge injection and the clock feed-through are caused by the different tendency of the input and the output signals of the complementary MOS transistor pairs. When the input signal changes from a low-leveled voltage to a high-leveled voltage, the output signal changes from a high-leveled voltage to a low-leveled voltage.

During the changing of the input signal, due to the charge injection and the clock feed-through, a transient signal is generated and coupled to the output signal, which generates a higher-leveled voltage signal at the falling edge of the output signal. Similarly, a lower-leveled voltage signal at the rising edge of the output signal is generated. Thus, the performance of the pre-emphasis of FIG. 4 is affected.

Figure 5:
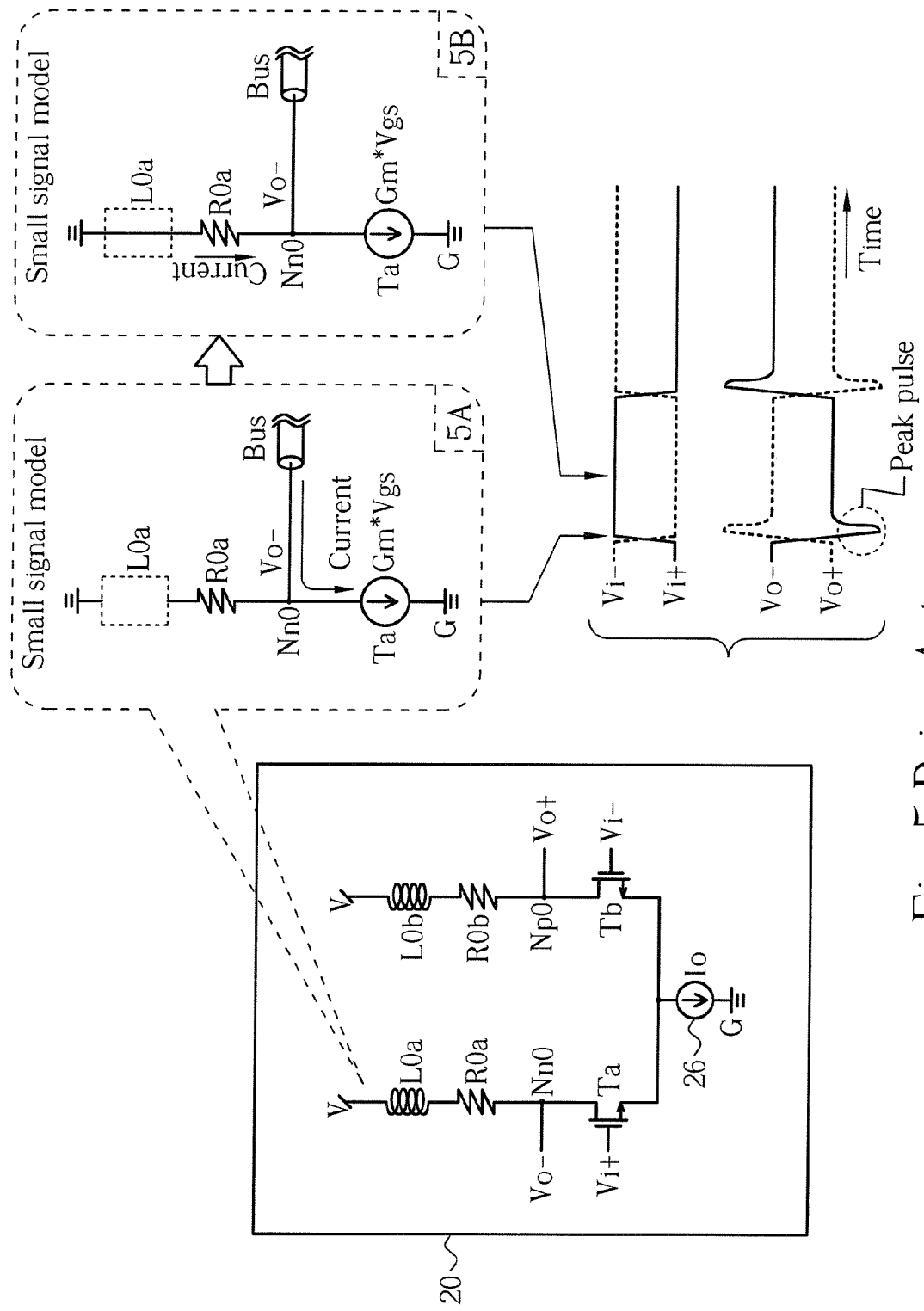
FIG. 5 is a diagram illustrating another kind of conventional differential transmitter.

Please refer to FIG. 5, which illustrates another kind of conventional differential transmitter 20 (in short as transmitter 20 thereinafter). The transmitter 20 uses current mode logic to realize the transmission circuit 110. The transmitter 20 comprises two matching n-type MOS transistors Ta and Tb, two matching resistors R0a and R0b, two matching inductors L0a and L0b, and a dc current source 26 for providing a dc load current lo. The transmitter 20 is biased between the dc voltages V and G. If the input signal Vi+ is a high-leveled voltage and the signal Vi− is a low-leveled voltage, the transistor Ta is turned on and the transistor Tb is turned off. The turned-on transistor Ta generates a voltage drop across the resistor R0a with the induced current lo and an output signal Vo− of the low-leveled voltage at the node Nn0. On the other hand, the turned-off transistor Tb generates no voltage drop across the resistor R0b and an output signal Vo+ of the high-leveled voltage at the node Np0. Similarly, if the input signal Vi+ is a low-leveled voltage and the signal Vi− is a high-leveled voltage, the transistor Ta is turned off and the transistor Tb is turned on, respectively generating the output signal Vo+ of the low-leveled voltage at the node Np0 and the output signal Vo− of the high-leveled voltage at the node Nn0.

When the voltages of the output signals Vo+ and Vo− change according to the voltages of the input signals Vi+ and Vi−, the inductors L0a and L0b of the transmitter 20 become temporary open for assisting the transmitter 20 in emphasizing the output signals Vo+ and Vo−. Please refer to FIG. 5A and FIG. 5B in FIG. 5, which illustrates the small-signal model of the transmitter 20. The voltage across the gate and the source of the transistor is Vgs, and the small-signal model transduction of the transistor is Gm. Take the part "Ta-R0a-L0a" for example, when the signal Vi+ changes from the low-leveled voltage to the high-leveled voltage, in the transient state, the inductor La0 is open and no current flow through the resistor R0a to the node Nn0. Thus, the current through the turned-on transistor Ta is completely utilized for discharging the voltage of the node Nn0, which quickly lower the voltage of the node Nn0. In the steady state, the inductor L0a is short, and the current through the turned-on transistor Ta also flow through the resistor R0a, which generates a voltage drop according to the resistor R0a at the node Nn0. Thus, the output signal Vo− of a low-leveled voltage is generated. That is, the transmitter 20, with the work of the inductor, generates a pre-emphasized peak pulse at the falling edge of the output signal Vo−. Similarly, the transmitter 20 establishes the pre-emphasized peak pluses at the falling and rising edges of the output signals Vo+ and Vo−, realizing the pre-emphasis.

However, there are still disadvantages of the conventional differential transmitter 20 in FIG. 5. First, the circuit structure of the transmitter 20 can not be applicable to the kind of transmitters with the complementary MOS pairs. Second, the coil structure of the inductors of the transmitter 20 uses a great deal of layout area. Thus, it is not economical.

To overcome all disadvantages of the conventional transmission circuits described above, the present invention provides a better structure of the transmitter and the transmission circuit. Please refer to FIG. 6 which is a circuit diagram illustrating the transmitter 30 of the present invention. The transmitter 30 realizes the transmission circuit 110 in FIG. 2, wherein the transmission data (input data D) are transformed into the differential input signals Vi+ and Vi− by the transformation circuit 32 so that the transmitter 30 transmits the differential output signals Vo+ and Vo− through the bus to the receiving circuits according to the differential input signals Vi+ and Vi−.

The transmitter 30 of the present invention is biased between the dc voltages V and G. The transmitter 30 comprises two matching p-type MOS transistors M1 and M2, and two matching n-type MOS transistors M3 and M4. The transistors M1 and M4 form a complementary MOS pair while the transistors M2 and M3 form another complementary MOS pair. The two complementary MOS pairs form two matching driving circuits. Each of the driving circuits has its own input signal and output node. According to the voltage level of the input signal, each driving circuit outputs the current of different direction respectively. For example, the driving circuit composed of the p-type MOS transistor M2 and n-type MOS transistor M3 receives the input signal Vi+ at the gates of the two transistors and transmits the output signal Vo− to the bus through the output node Nn. Similarly, another driving circuit composed of the p-type MOS transistor M1 and n-type MOS transistor M4 receives the input signal Vi− at the gates of the two transistors and transmits the output signal Vo+ to the bus through the output node Np. Additionally, the transmitter 30 also comprises two matching current source 36a and 36b, and two matching load resistors Rp and Rn. Each of the current sources provides a predetermined size of the load current l. The load resistors Rp and Rn respectively serve as load units coupled to the output nodes Np and Nn, matching the equivalent output impedance of the bus and the receiving circuit.

Figure 6:
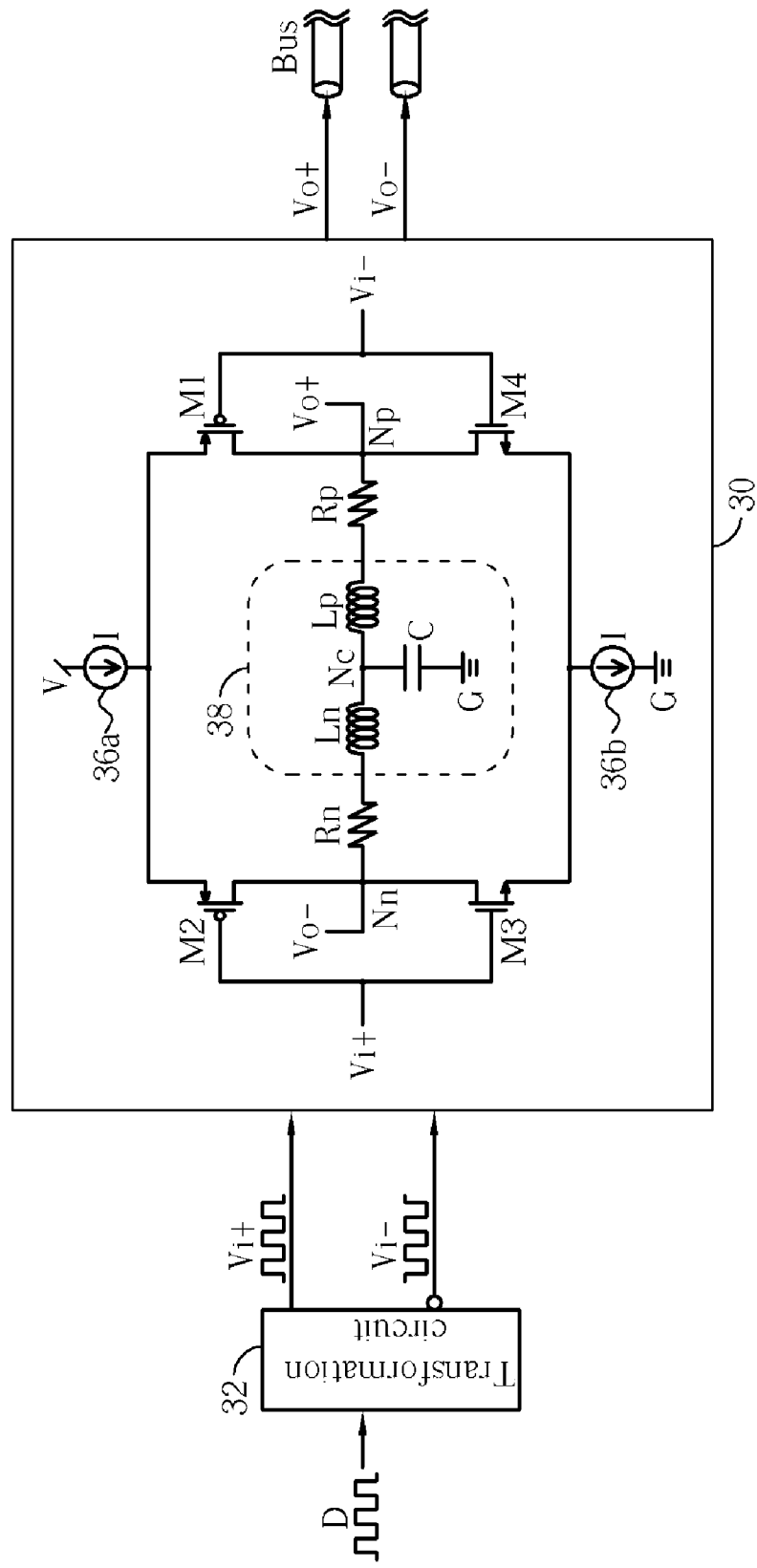
FIG. 6 is a circuit diagram illustrating the transmitter of the present invention.

The transmitter 30 also comprises a switch circuit 38 coupled in series between the two resistors Rp and Rn. The switch circuit 38 controls each load unit (resistors Rp and Rn) to sink currents from the nodes Np and Nn. In the embodiment of FIG. 6, the switch circuit 38 comprises two matching inductors Lp and Ln serving as two switch units. One ends of the inductors Lp and Ln are respectively coupled to the resistors Rp and Rn while the other ends of the inductors Lp and Ln are jointly coupled to the common mode node Nc. As shown in FIG. 6, the circuit structure of the transmitter 30 is symmetric to the common mode node Nc. Thus the voltage of the node Nc serves as the common mode voltage of the differential output signals Vo+ and Vo−. The differential output signals Vo+ and Vo− are opposite in phase to each other based on the voltage level of the common mode. Thus, the transmitter 30 of the present invention also comprises a capacitor C coupled to the common mode node Nc for voltage stabilization.

In each driving circuit of the transmitter 30, two complementary driving units are turned on or turned off according to the voltage level of the input signal. That is, if the voltage of the input signal is low, one of the driving units is turned on while the other of the driving units is turned off. The turned-on driving unit enables the current to pass through so that the driving circuit provides the currents of different directions according to the turned-on driving unit. For instance, in the driving circuit composed of the transistors M2 and M3, when the input signal Vi+ is a high-leveled voltage, the transistor M3 is turned on and the transistor M2 is turned off. The turned-on transistor M3 sinks the currents from the node Nn to the load current l provided by the current source 36b. When the input signal Vi+ is a low-leveled voltage, the transistor M2 is turned on and the transistor M3 is turned off. The turned-on transistor M2 sources the currents to the node Nn from the load current I provided by the current source 36a. Similarly, in the driving circuit composed of the transistors M1 and M4, when the input signal Vi− is a high-leveled voltage, the driving circuit sinks currents from the node Np. And when the input signal Vi− is a low-leveled voltage, the driving circuit sources currents to the node Np.

Figure 7:
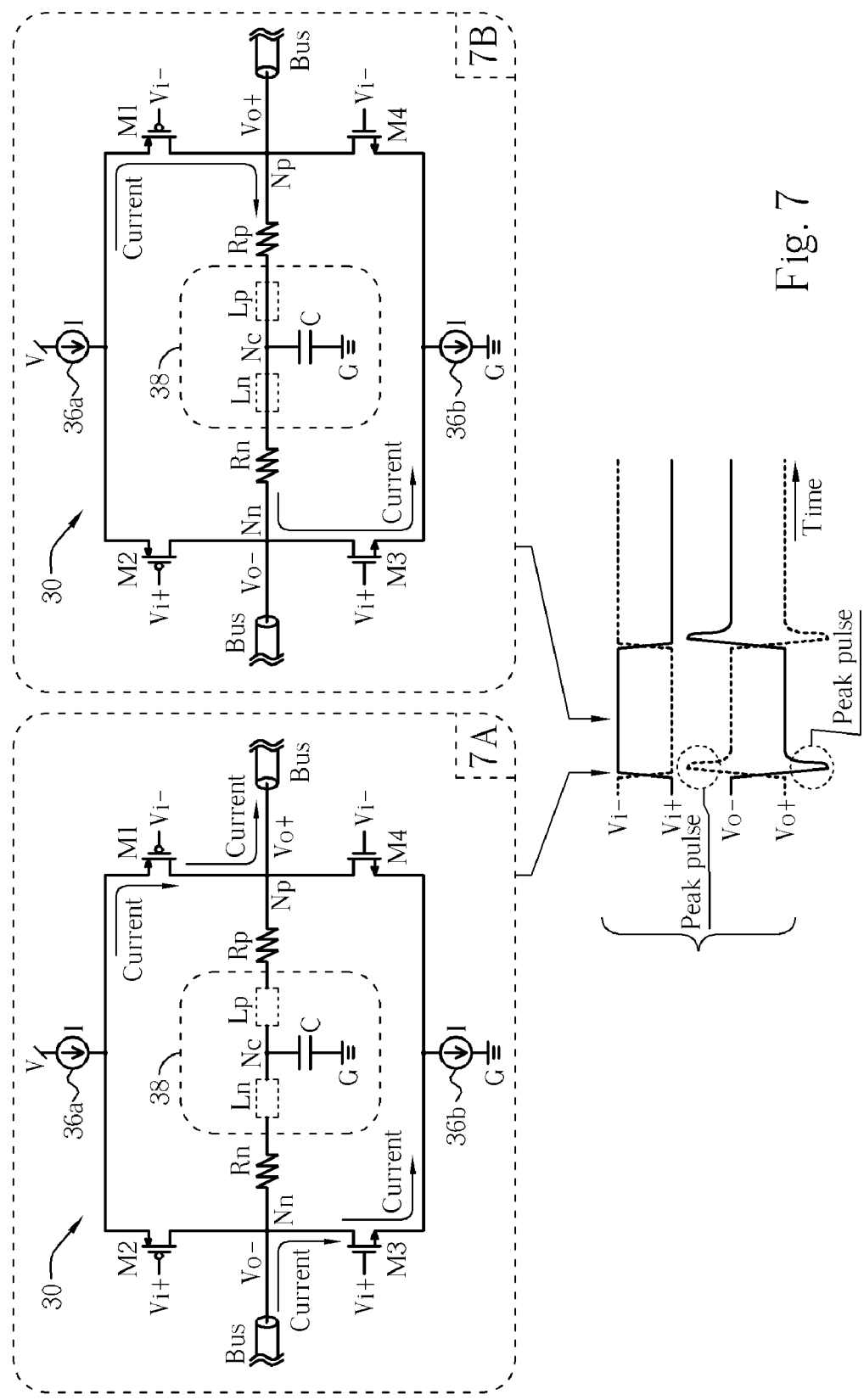
FIG. 7 is a diagram illustrating the operation of the transmitter of the present invention shown in FIG. 6.

Please refer to FIG. 7, which illustrates the operation of the transmitter 30 of the present invention. As shown in FIG. 7A, when the input signal Vi+ changes from a high-leveled voltage to a low-leveled voltage and the input signal Vi− changes with the opposite tendency, the transistors M1 and M3 change from turned off to be turned on and the transistors M2 and M4 change from turned on to be turned off. Meanwhile, in the switch circuit 38, the inductors Ln and Lp are open due to the changes of the currents passing through the inductors Ln and Lp. Consequently, the connection between the nodes Np and Nn is broken, ceasing the currents from passing through the resistors Rp and Rn. Thus, the currents passing by the transistors M3 completely discharge the equivalent output impedance of the bus and the receiving circuit through the node Nn without being distracted by the resistor Rn so that the output signal Vo− at the node Nn is lowered down quickly. And, the currents passing by the transistors M1 completely charge the equivalent output impedance of the bus and the receiving circuit through the node Np without being distracted by the resistor Rp so that the output signal Vo+ at the node Np is risen up quickly.

When the voltage levels of the input and output signals becomes from the transient state to the steady state, the inductors Ln and Lp of the switch circuit 38 are steadily short, connecting the node Nn to the node Np. As shown in the FIG. 7B, when the short-circuit inductors Lp and Ln connects the node Np to the node Nn, the turned-on transistors M1 passes the current to the transistor M3 in the direction of the node Np to the node Nn and the voltage across the resistors Rp and Rn is established. The output signal Vo+ of the high-leveled voltage and the output signal Vo− of the low-leveled voltage are established according to the voltage across the resistors Rp and Rn.

As the waveform shown in FIG. 7, when the voltage levels of the input and output signals change (in FIG. 7A), because the switch circuit 38 breaks the connection between the nodes Nn and Np, the equivalent impedance of the bus and the receiving circuit have the priority to be charged and discharged, and the emphasized peak pulses at the rising edges and falling edges of the output signals Vo+ and Vo− are generated for realizing the pre-emphasis of FIG. 2. Furthermore, the charge injection and the clock feed-through are eliminated as a result of the quickened charging and discharging process. On the other hand, when the input and output signals become the steady state (in FIG. 7B), because the connection between the nodes Np and Nn is established by the switch circuit 38, enabling the currents to pass through the internal impedance of the transmitter 30, the output signals Vo+ and Vo− are established according to the load current 1 and the resistors Rp and Rn.

Figure 8:
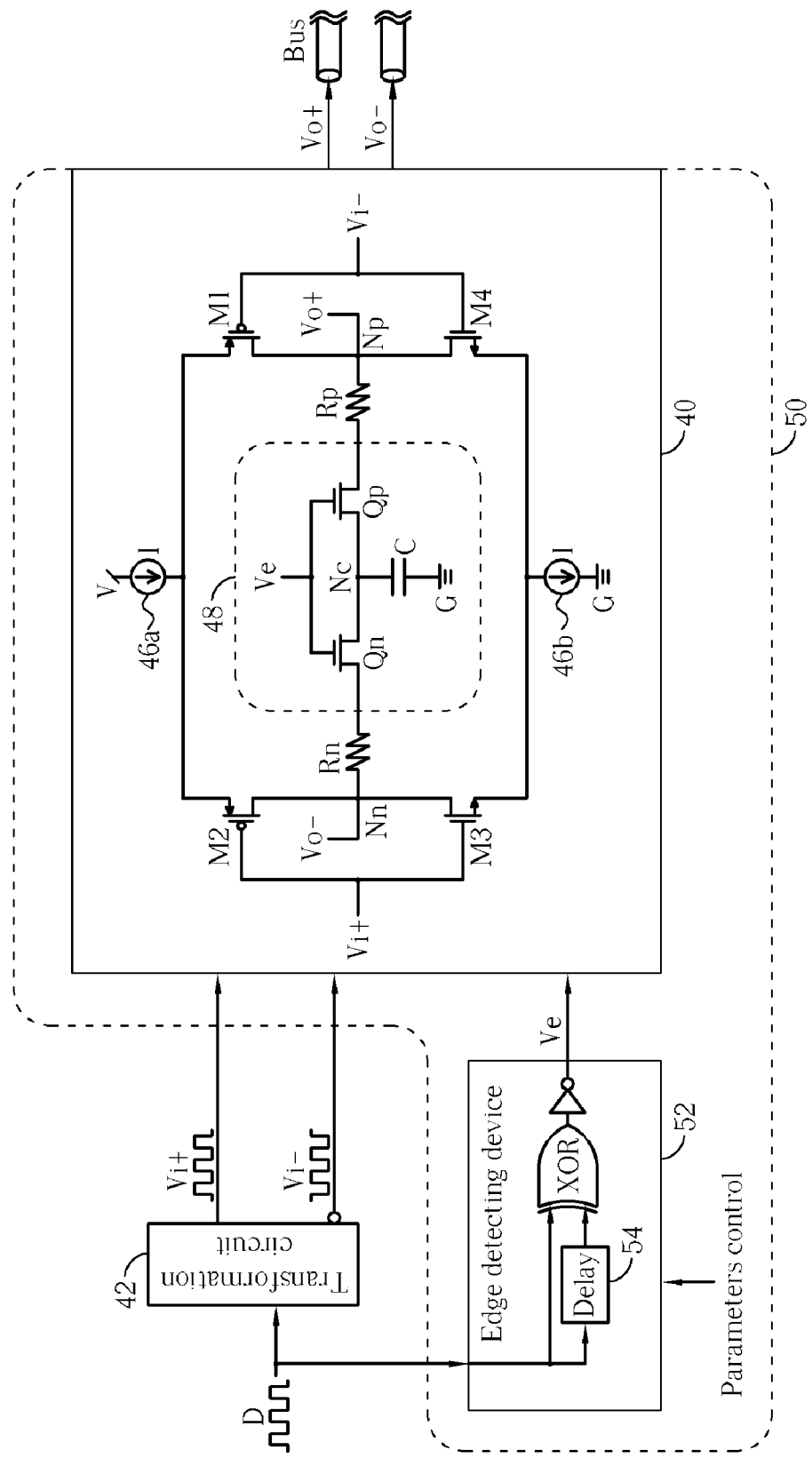
FIG. 8 is a circuit diagram illustrating another embodiment of the transmitter and the transmission circuit of the present invention.

Please refer to FIG. 8 which is a circuit diagram illustrating another embodiment of the transmitter and the transmission circuit of the present invention. The transmission circuit 50 realizes the transmission circuit 110 of FIG. 2. The transmission circuit 50 comprises a transformation circuit 42, a transmitter 40, and an edge detecting device 52. The transmission data serve as the input signals D of the transmission circuit 50, and are transformed into two differential input signals Vi+ and Vi− which are opposite in phase to each other by the transformation circuit 42. The transmitter 40 respectively establishes output signals Vo+ and Vo− at the output node Np and Nn according to the input signals Vi+ and Vi− and transmits the signals Vo+ and Vo− through the bus to the receiving circuit.

Similar to the transmitter 30 of FIG. 6, the transmitter 40 is biased between the dc voltages V and G, and comprises two matching p-type MOS transistors M1 and M2, and two n-type MOS transistors M3 and M4. Each of the MOS transistors M1 to M4 serves as a driving unit. A driving circuit composed of a complementary MOS pair of the transistors M1 and M4 establishes the output signal Vo+ according to the input signal Vi− and another driving circuit composed of a complementary MOS pair of the transistors M2 and M3 establishes the output signal Vo− at another output node Nn according to the input signal Vi+. Additionally, the transmitter 40 comprises two matching current sources 46a and 46b to provide the dc load current 1. The two output node Np and Nn are respectively coupled to two matching load resistors Rp and Rn serving as the load units matching the external output impedance of the transmitter 40.

The transmitter 40 of the present invention further comprises a switch circuit 48 coupled between the output nodes Np and Nn. The switch circuit 48 comprises two matching n-type MOS transistors Qn and Qp, and a capacitor C. The drains of the two transistors Qn and Qp are respectively coupled to the resistors Rn and Rp, and the sources of the two transistors Qn and Qp are jointly coupled to a common mode node Nc. The capacitor C is coupled between the common mode node Nc and ground. Both of the transistors Qn and Qp serves as a switch unit and controls the connection between the nodes Nn and Np according to a signal Ve of the edge detecting device 52. The capacitor C stabilizes the voltage of the common mode node Nc. The edge detecting device 52 detects the rising and falling edges of the input signal D and accordingly generates a signal Ve. When the transistors Qp and Qn are turned on by the detecting signal Ve, the connection between the nodes Nn and Np is established. When the transistors Qn and Qp are turned off by the detecting signal Ve, the connection between the nodes Nn and Np is broken.

As shown in FIG. 8, the edge detecting circuit 52 comprises a delay device 54 for delaying the input signal D and an exclusive—or gate for operating the exclusive—or calculation of the delayed input signal D and the input signal D. The result of the exclusive—or calculation reveals the rising and falling edges of the input signal D. According to the result of the exclusive—or calculation, the edge detecting circuit 52 generates the detection signal Ve. Thus, the detection signal Ve turns off the transistors Qp and Qn at the rising and falling edges of the input signal D for emphasizing the rising and falling edges of the output signals Vo+ and Vo−. The operations of the transmission circuit 50 and the transmitter 40 are described in detail as follows.

Figure 9:
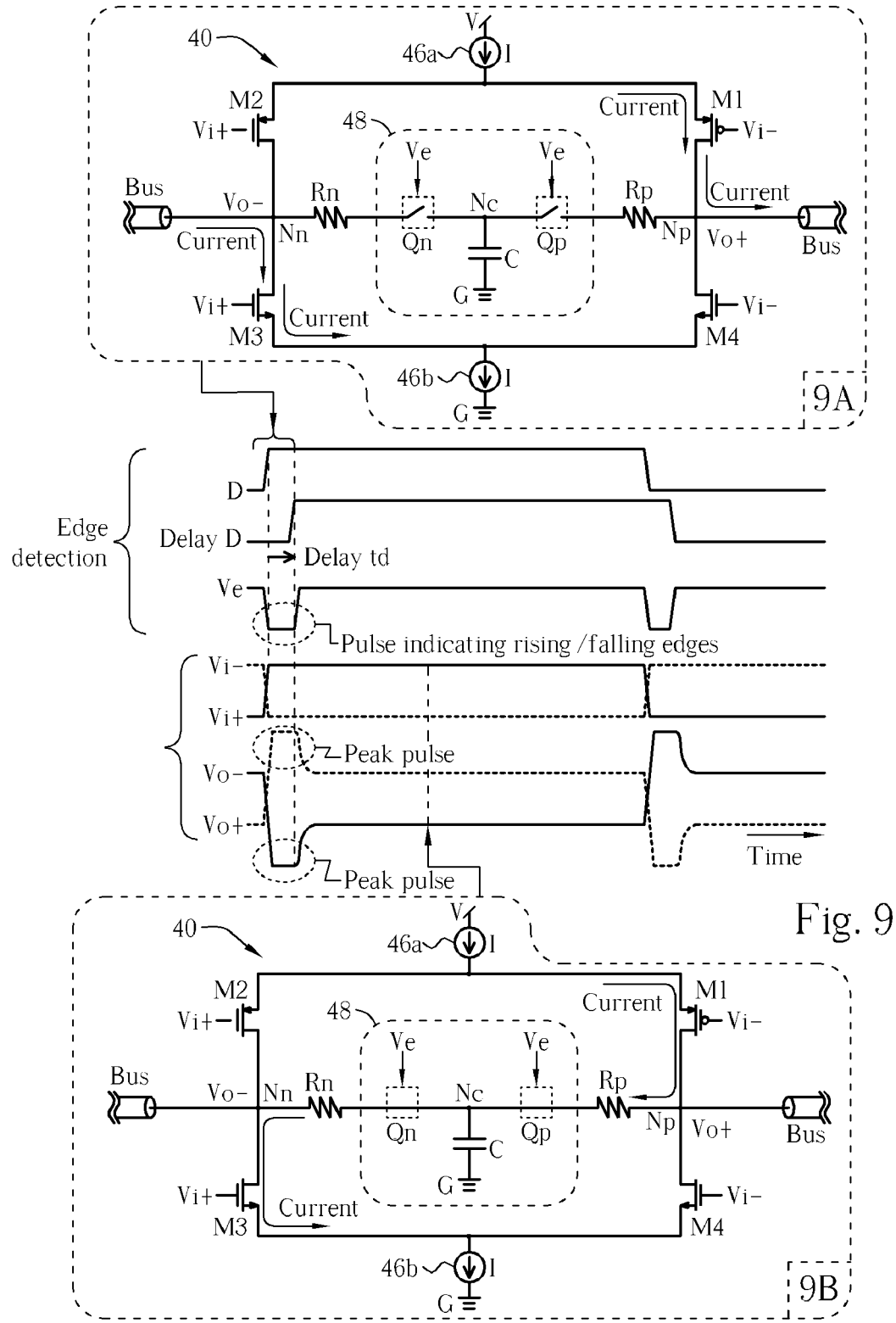
FIG. 9 is a diagram illustrating the operations of the transmitter and the transmission circuit of the present invention shown in FIG. 8.

Please refer to FIG. 9 which is a diagram illustrating the operations of the transmitter 40 and the transmission circuit 50 of the present invention. As the waveform shown in FIG. 9, when the voltage of the input signal D changes, the delayed input signal D changes after the change of the input signal D for a period of time td. Thus, during this period of time td, the voltage of the input signal D is different from that of the delayed input signal D. The detection signal Ve is the result of the calculation of the input signal D and the delayed input signal D, having a pulse of width td at the falling and the rising edges of the input signal D.

As shown in FIG. 9A of FIG. 9, when the input signal Vi+ changes from a low-leveled voltage to a high-leveled voltage while the input signal Vi− changes from a high-leveled voltage to a low-leveled voltage, the transistors M1 and M3 are turned on and the transistors M2 and M4 are turned off.

Meanwhile, the change of the input signals Vi+ and Vi– (input signal D) enables the edge detecting device 52 to generate a pulse of width td on the detection signal Ve. The pulse turns the transistors Qp and On of the switch circuit 48 off and breaks the connection between the nodes Nn and np. Thus, the currents does not flow through the resistors Rp and Rn. Due to the disconnection between the nodes Nn and Np, the currents passing through the turned-on transistors M1 and M3 completely charge or discharge the impedance of the bus and the receiving circuit, enabling the output signals Vo+ and Vo– to change quickly.

As shown in FIG. 9B of FIG. 9, when the input signal Vi+ remains a high-leveled voltage and the input signal Vi– remains a low-leveled voltage, the transistors M1 and M3 are turned on, and there is no pulse generated on the detection signal Ve. Thus, the transistors Qn and Qp are turned on and the connection between the nodes Nn and Np are established. The currents passing through the turned-on transistors M1 and M3 pass through the resistors Rp and Rn for establishing the output signals Vo+ and Vo–.

As known from the description above, the switch circuit 48 of the transmitter 40 of the present invention serves the same function as the inductors of FIG. 6. Therefore, the transmitter 40 also realizes the pre-emphasis. Furthermore, the transmitter 40 controls the characteristics of the emphasized peak pulse such as the width of the pulse. As the waveform plot shown in FIG. 9, the widths of the emphasized peak pulses of the output signals Vo+ and Vo– are controlled by the period when the transistors Qp and Qn are turned off. The period when the transistors Qp and Qn are turned off is controlled according to the pulse width of the detection signal Ve, which is controlled by the delay td of the delay circuit 54. Thus, only controlling the delay td is able to control the widths of the emphasized peak pulses of the output signals Vo+ and Vo–.

Additionally, the edge detecting device 52 is an exemplary embodiment and is not limiting as the spirit of the invention is intended to cover situations when any other circuit is used for detecting the rising or the falling edges.

The present invention uses only one transmitter and no inductors, reducing the applied layout area and the power dissipation. Furthermore, the present invention also provides the flexibility of the width of the emphasized peak pulse. Therefore, the present invention has wider application than the prior art.

Figure 10:
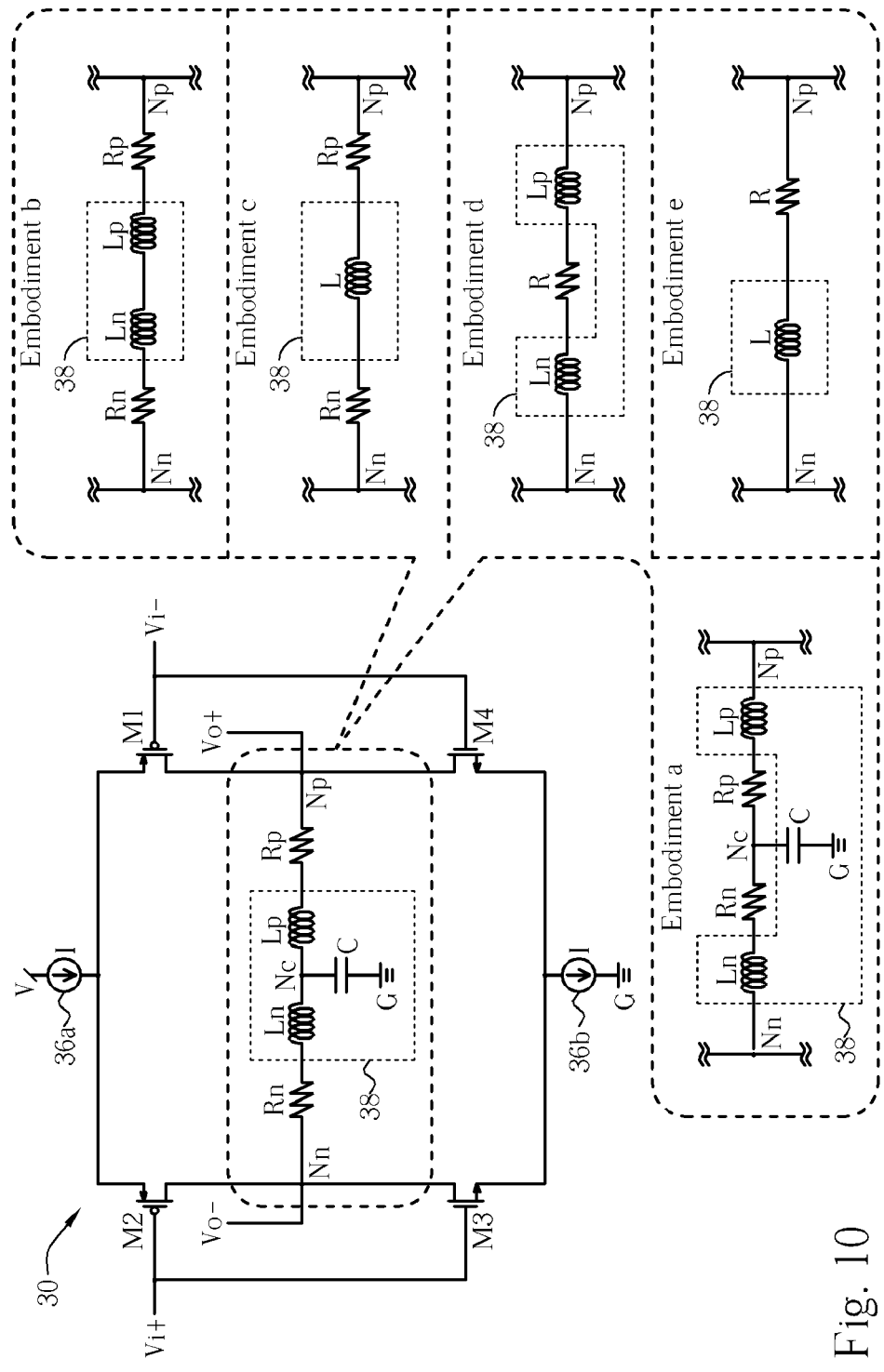
FIG. 10 is a diagram illustrating the other embodiments of the transmitter of the present invention shown in FIG. 6.

Please refer to FIG. 10, which is a diagram illustrating the other embodiments of the transmitter 30 of the present invention. In the embodiment a, the positions of the inductors Lp and Ln are exchanged with those of the resistors Rp and Rn. In the embodiment b, the capacitor C is cancelled. In the embodiment c, there is only one inductor L disposed in the switch circuit 38. In the embodiment d, there is only one resistor R serving as a load unit between the nodes Nn and Np. In the embodiment e, there is one single inductor L disposed in the switch circuit 38.

Figure 11:
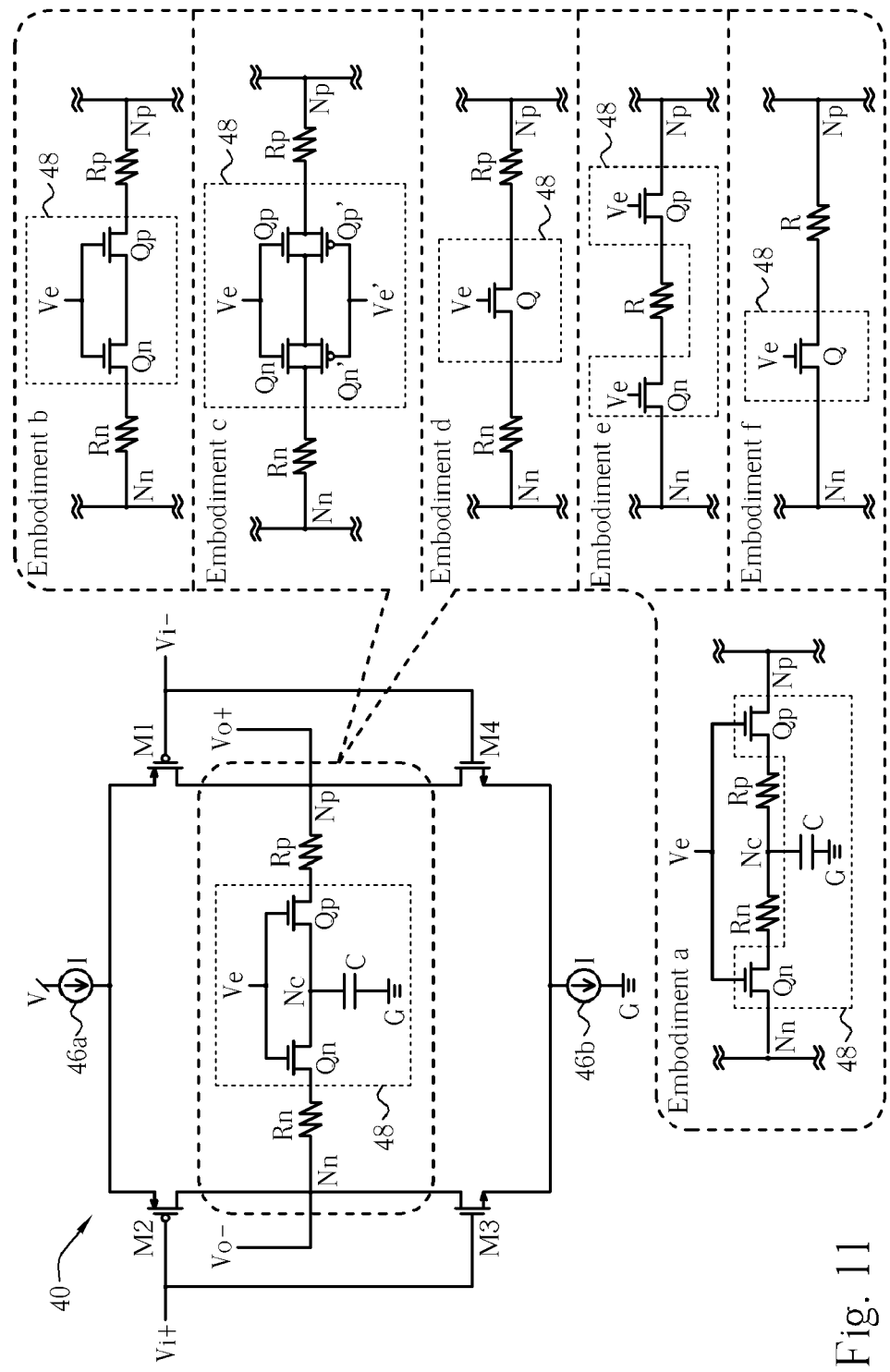
FIG. 11 is a diagram illustrating the other embodiments of the transmitter of the present invention shown in FIG. 8.

Please refer to FIG. 11, which is a diagram illustrating the other embodiments of the transmitter 40 of the present invention. In the embodiment a, the positions of the transistors Qn and Qp are exchanged with those of the resistors Rp and Rn. In the embodiment b, the capacitor C is cancelled. In the embodiment c, the switch unit of the switch circuit 48 are realized with transmission gates; wherein one transmission gate is composed of the n-type MOS transistor Qp and p-type MOS transistor Qp' while the other transmission gate is composed of the n-type MOS transistor Qn and p-type MOS transistor Qn'. Consequently, the edge detecting circuit 52 have to accordingly provide the differential detection signals Ve and Ve' to trigger the transmission gates. In the embodiment d, the switch circuit 48 only comprises a transistor Q serving as a switch unit. In the embodiment e, one single resistor R serving as a load unit is disposed between the nodes Np and Nn while the two matching switch transistors Qn and Qp of the switch circuit 48 are symmetrically disposed at the both ends of the resistor R. In the embodiment f, a single switch transistor Q matching with a single resistor R form the internal impedance and the connection between the two output nodes. The spirit of the embodiments in FIG. 8, FIG. 9, and FIG. 11 is using the switch units of the switch circuit 48 along with the edge detecting device 52 to form a simulated inductor. The switch units can be realized with different kind of transistors or transmission gates. The advantage of the n-type MOS transistors is the faster switching speed since the carriers of the n-type MOS transistors own higher mobility. The advantage of the transmission gate is the lower voltage drop across the transmission gate when it is turned on.

Figure 12:
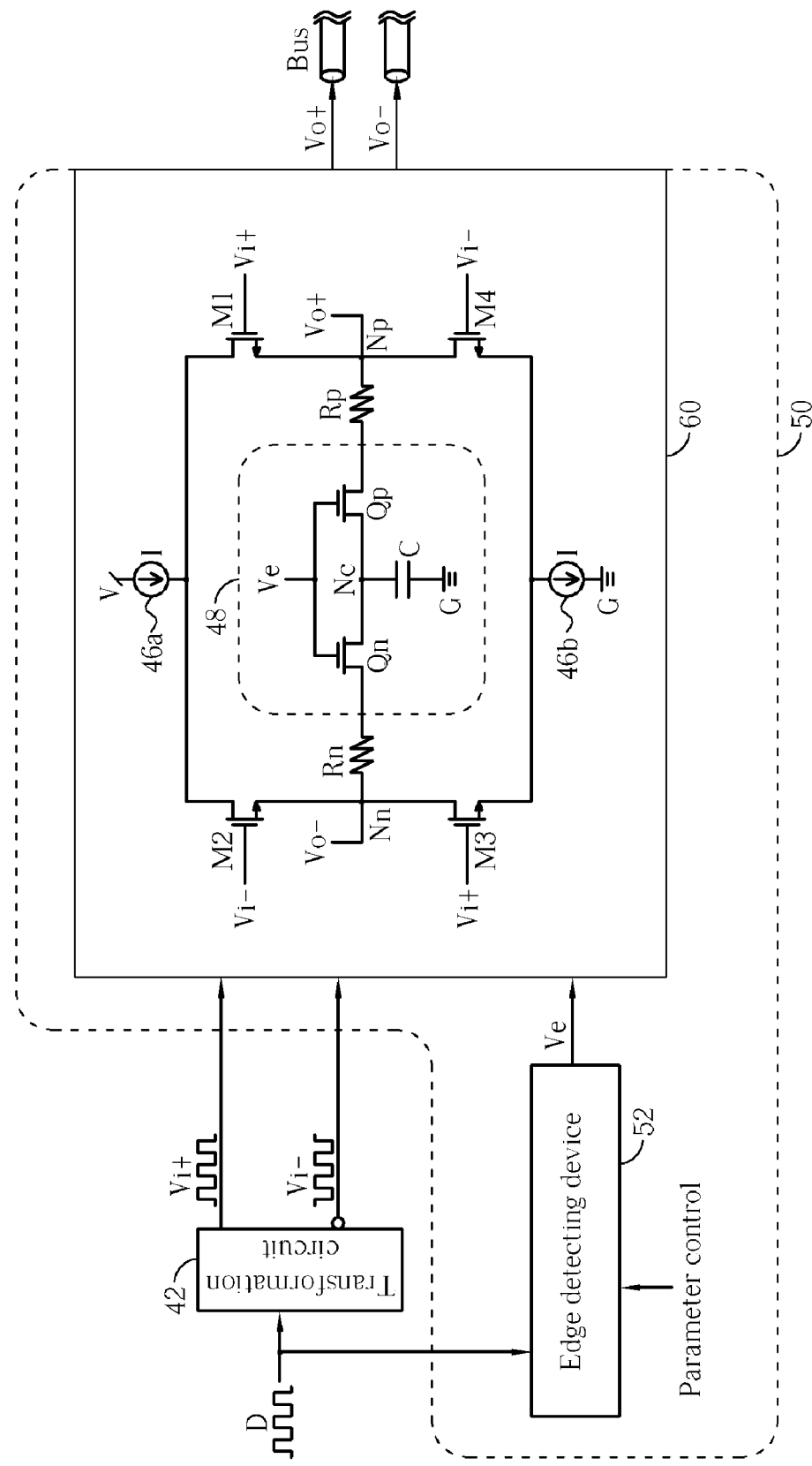
FIG. 12 is a diagram illustrating the transmitter of the present invention.

Please refer to FIG. 12, which is a diagram illustrating the transmitter 60 of the present invention. In the transmitter 60, the p-type MOS transistor of FIG. 8 is replaced with the two matching n-type MOS transistors M1 and M2, and a driving circuit is composed of the transistors M2 and M3 while another drive circuit is composed of the transistors M1 and M4. The driving circuit composed of transistors M2 and M3 provides output signal Vo– according to the input signal Vi+. The driving circuit composed of transistors M1 and M4 provides output signal Vo+ according to the input signal Vi–. Additionally, since the p-type MOS transistors of FIG. 8 are replaced with the n-type MOS transistors, as shown in FIG. 12, the controlling signals of the transistors M1 and M2 are changed to be the signals Vi+ and Vi– respectively. As for the operations of the switch circuit 48 and the edge detecting circuit 52, it is as the same as in the embodiment in FIG. 8 and is omitted. The structure of the driving circuits of the transmitter 60 is also applicable to the embodiment of FIG. 6.

In summary, compared with the each transmitter and transmission circuit of the prior art, the transmitter and transmission circuit of the present invention emphasize the rising and falling edges of the output signals by utilizing the transmitter to drive the voltage change of the external output impedance first so that only a transmitter is used to realize the technique of the pre-emphasis with the lower power dissipation and the smaller layout area for increasing the quality of the signal transmission. Additionally, the present invention also utilizes the switch circuit matching with the edge detecting circuit to simulate the inductance effect at the voltage change of the signal for further reducing the layout area needed in the transmitter of the present invention and controlling conveniently the characteristics of the pre-emphasized peak pulses. The present invention is widely applicable to many bus protocols, e.g. USB (universal serial bus), IEEE 1394, and SATA (serial ATA). Besides, the present invention also is used in the LVDS transmitter (Low-Voltage Differential Signals).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmission circuit for receiving at least one input signal and providing an output signal according to each of the input signals, the transmission circuit comprising:

an edge detecting circuit for detecting rising edges or falling edges of each of the input signals and accordingly providing a detection signal; and a transmitter comprising:
two driving circuits, each of the driving circuits having a corresponding input signal and a corresponding output node providing a current at the corresponding output node having a direction according to the corresponding input signal;
two load units, each of the load units coupled to the corresponding output node and matching the output impedance of the corresponding output node; and
a switch circuit coupled with each of the load units in series to each of the output nodes, wherein one end of each of the load units is coupled to the corresponding output node and the other end of each of the load units is coupled to the switch circuit, receiving the detection signals for controlling each of the load units to sink the current at each of the output nodes according to the detection signal.

2. The transmission circuit of claim 1 wherein the switch circuit comprises two switch units, and one end of each switch unit respectively is coupled to one of the two load units while the other end of each switch unit jointly is coupled to a common mode node.

3. The transmission circuit of claim 2 wherein the switch circuit further comprises a capacitor coupled to the common mode node for stabilizing the voltage of the common mode node.

4. The transmission circuit of claim 1 wherein the edge detecting circuit transforms the rising edges and falling edges of each input signal into a pulse of the detection signal.

5. The transmission circuit of claim 4 wherein when the switch circuit receives the pulse of the detection signal, each load unit stops sinking currents from each output node.

6. The transmission circuit of claim 1 wherein each driving circuit comprises two complementary driving units, both of the two driving units coupled to the corresponding output node of the driving circuit, and one of the two driving units is turned on for passing the current to the corresponding output node according to the input signal while the other one of the two driving units is turned off.

7. The transmission circuit of claim 1 wherein each load unit is a resistor.

8. A transmitter comprising:
two driving circuits, each of the driving circuits having a corresponding input signal, a corresponding output node, and two driving units operating in a complementary manner and coupled to the corresponding output node, wherein one of the two driving units is turned on for passing a current to the corresponding output node with a corresponding direction according to the input signal while the other one of the two driving units is turned off;
two load units coupled to the corresponding output node and matching the output impedance of the corresponding output node; and
a switch circuit coupled with each of the load units in series to each of the output nodes, wherein one end of each of the load units is coupled to the corresponding output node and the other end of each of the load units is coupled to the switch circuit, receiving a detection signal for controlling each of the load units to sink the current at each of the output nodes according to the detection signal.

9. The transmitter of claim 8 wherein the switch circuit comprises two switch units, and one end of each switch unit respectively is coupled to one of the two load units while the other end of each switch unit jointly is coupled to a common mode node.

10. The transmitter of claim 9 wherein the switch circuit further comprises a capacitor coupled to the common mode node for stabilizing the voltage of the common mode node.

11. The transmitter of claim 9 wherein each of the switch units is an inductor.

12. The transmitter of claim 8 wherein the switch circuit comprises an inductor.

13. The transmitter of claim 8 wherein when the detection signal is provided by an edge detecting circuit according to rising edges and falling edges of each of the input signals.

* * * * *